(12) United States Patent
Reed et al.

(10) Patent No.: US 6,967,473 B1
(45) Date of Patent: Nov. 22, 2005

(54) ATTACHABLE/DETACHABLE VARIABLE SPACING PROBING TIP SYSTEM

(75) Inventors: Gary W. Reed, Beaverton, OR (US); Jim L. Martin, Tigard, OR (US); William R. Pooley, Aloha, OR (US); William A. Hagerup, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/856,376

(22) Filed: May 27, 2004

(51) Int. Cl.[7] ............ G01R 1/06; G01R 31/02
(52) U.S. Cl. .................. 324/149; 324/72.5
(58) Field of Search .............. 324/72.5, 133, 324/149, 754, 755, 758, 156–157

(56) References Cited

U.S. PATENT DOCUMENTS

| | | | |
|---|---|---|---|
| 4,721,903 A * | 1/1988 | Harsch et al. ............ 324/72.5 |
| 5,378,990 A * | 1/1995 | Terry ...................... 324/550 |
| 6,191,594 B1 | 2/2001 | Nightingale et al. |
| 6,276,956 B1 * | 8/2001 | Cook ...................... 439/482 |
| 6,400,167 B1 | 6/2002 | Gessford et al. |
| 6,404,215 B1 | 6/2002 | Nightingale et al. |
| 6,466,000 B1 | 10/2002 | Nightingale |
| 6,603,297 B1 | 8/2003 | Gessford et al. |
| 6,704,670 B2 | 3/2004 | McTigue |

* cited by examiner

Primary Examiner—Vinh Nguyen
Assistant Examiner—Russell M. Kobert
(74) Attorney, Agent, or Firm—William K. Bucher

(57) ABSTRACT

An attachable/detachable variable spacing probing tip system has a housing that receives pivoting probing arms. Each probing arm has a support member and a probing arm portion of a flexible substrate having a conductive trace thereon. One end of each conductive trace is coupled to a probing contact and the other end coupled to an electrical contact pad on a electrical contact pad portion of the flexible substrate. Each of the probing arm portions has a generally S-shaped fold therein extending from the support members to the electrical contact portion of the flexible substrate. The housing includes means for pivoting the probing arms. The rear surface of the housing has a resilient member disposed therein. Latching means in the housing secures the electrical contact pad portion of the flexible substrate to the rear surface of the housing. Opposing attachment arms from a rear surface of the housing.

18 Claims, 9 Drawing Sheets

ATTACHABLE/DETACHABLE VARIABLE SPACING PROBING TIP SYSTEM

BACKGROUND OF THE INVENTION

The present invention is directed generally to variable spacing probing tips and more particularly to an attachable/detachable variable spacing probing tip system for a measurement probe where the variable spacing probing tips are attachable and detachable from the measurement probe.

Variable spacing probing tip adapters have been used for many years with differential measurement probes. U.S. Pat. No. 6,400,167 describes two versions of variable spacing probing tip adapters for differential probes. The first adapter is referred to as a Longhorn Adapter, manufactured and sold by Tektronix, Inc., Beaverton, Oreg., under Part No. 016-1780-00 and used with the P6200 family of differential probes sold by Tektronix, Inc. The P6200 family of differential probes has a measurement probe head with dual socket type probing tips extending from the nose of the probe head. The Longhorn adapter has offset probing tips that are ganged together with an insulating material, such as plastic or the like. The ganged probing tips each have a contact shaft extending from the insulating material with a pitch geometry of the contact shafts compatible with the socket type probing tips. Below the insulating material, the probing tips have bends formed in them to offset the probing tips which allow the probing tips to rotate to match various pitch geometries of probing points on a device under test.

The other version of the variable spacing probing adapter is also sold by Tektronix, Inc. under Part No. 016-1885-00 and used with the P6330, P7330 and P7350 differential probes. These differential probes have a probe head with probing tips extending from the nose of the probing head. The variable spacing probing adapter has a holder with a cavity at one end and bores extending from the cavity to the front of the holder. The bores have a pitch geometry that matches the pitch geometry of the probing tips extending from the nose of the probing head. Probe point elements are disposed in the bores of the holder with one end exposed in the holder cavity and the other end extending from the end of the holder. The ends of the probe point elements exposed within the cavity have a bore formed therein that is filled with a conductive elastomer material. The ends of the probing point elements extending from the end of the holder are angled and tapered to a point to form angled probing tips. The holder is positioned over the probe head nose with the probing tips in the nose puncturing the electrically conductive elastomer in the respective bores of the probe point elements. The angled probing tips of the probe point elements are rotatable within the holder to allow the probing tips to be matched to the various pitch geometries of the probing points on the device under test.

As the bandwidth of measurement instruments, such as oscilloscopes and the like, increases, there is a corresponding need for measurement probes having equal or greater bandwidths. A drawback to the above described probing tip adapters is the effects of probe tip capacitance and inductance on the overall bandwidth of the probe. The additional lead length produced by the probing tips of the probing tip adapters increases the overall capacitance and inductance of the probing tips which degrades the overall bandwidth of the probe. One solution to this problem is to separate the probing tips from the active circuitry in the probing head of the measurement probe. U.S. Pat. No. 6,704,670 describes a wideband active probing system where the probing tip or tips of the probe are separable from a probe amplifier unit. One or more probe cables are connected to a probe tip unit which are connected to the probe amplifier unit for conveying signals received by a probe unit. Various types of probe tip units may be connected to the probe amplifier unit. The probe tip unit may contain circuitry ranging from conductor traces to various resistive, capacitive, and/or other electronic elements. An advantage of such a probe design is that it allows the placement of the substantially smaller probe tip unit onto difficult to reach contacts on a device under test instead of a larger measurement probe containing probe amplifier circuitry.

One type of probe tip unit for the wideband active probing system is a differential probe unit. The differential probe unit includes a probe unit housing and probe assemblies. Each probe assembly includes a probe barrel, a probe barrel nose cone and a probing tip. The center conductor of the probe cable is electrically coupled to the probing tip and an outer shielding conductor of the probe cable is electrically coupled to the probe barrel. The probe barrels are partially disposed within the probe housing with the probe barrel nose cones attached to the respective probe barrels extending outward from the probe housing. The probing tips extend partially out of the respective probe barrel nose cones. The longitudinal axis of each probe barrel nose cone is offset at an angle from the longitudinal axis of its respective probe barrel. The probe barrels are rotatable within the probe unit housing. This allows the probing tips to be rotated to various separation distances to match the separation distances of probe points on a device under test. The differential probe unit further includes elastic compressible elements that allow the probe assemblies to move along the longitudinal axis of the probe barrels for mating with probe points of differing heights on the device under test.

While the commercial implementation of the above described wideband active probing system provides a 7 GHz bandwidth, the future of measurement instruments and probes is for higher and higher bandwidth capability. This will require reducing the capacitive and inductive effects of the probing tips below what is capable with existing variable spacing differential probes. What is needed is a variable spacing differential probing tip system that provides greater bandwidth than existing variable spacing differential probing solutions. The variable spacing differential probing system should be compact to allow probing of fine pitched probing points on a device under test while at the same time allowing ease of adjustment of the probe spacing. The variable spacing differential probing tip system should also be attachable and detachable from the measurement probe to allow for a variety of probing tip solutions for the same measurement probe.

SUMMARY OF THE INVENTION

Accordingly, the present invention is an attachable/detachable variable spacing probing tip system for a measurement probe. The probing tip system has a hollow housing with an opening at one end into the housing cavity. Opposing attachment arms extend from a rear surface of the housing. Disposed within the housing cavity are first and second pivoting probing arms that extend out past the open end of the housing. Each of the pivoting probing arms has a support member and a flexible substrate. The flexible substrate has first and second probing arm portions secured to the respective support members. Each probing arm portion has a conductive trace with one end of the conductive trace coupled to a probing contact and the other end coupled to an electrical contact pad on an electrical contact pad portion of the flexible substrate. Each of the probing arm portions of the flexible substrate has a generally S-shaped fold therein extending from the first and second support members to the electrical contact pad portion of the flexible substrate. The electrical contact pad portion of the flexible substrate extends from the rear surface of the housing. The housing includes means for pivoting the first and second pivoting probing arms. The rear surface of the housing has at least a first non-compressive set, resilient member disposed therein. Latching means are provided in the housing for securing the electrical contact pad portion of the flexible substrate to the rear surface of the housing with the electrical contact pads disposed adjacent to the non-compressive set, resilient member.

The variable spacing probing tip system may include passive electrical elements disposed on the flexible substrate and electrically coupled with the conductive traces on each of the pivoting probing arms. The passive electrical elements may include resistive and capacitive elements. The resistive and capacitive elements may be discrete surface mounted elements or printed electrical elements. Each of the conductive traces on the pivoting probing arms may be implemented as a controlled impedance transmission line, such as a coplanar waveguide, microstrip or the like. The flexible substrate preferably has a lateral member disposed adjacent to the distal ends of the first and second pivoting probing arms and connected to the first and second probing arm portions.

The bottom surface of the housing has a raised surface that is laterally disposed in the opening of the housing for supporting the pivoting probing arms. An axial raised portion is disposed in the opening of the housing having an arcuate top surface extending above the laterally disposed raised surface and is coextensive with the lateral member of the flexible substrate. The housing is preferably formed of a first housing member that includes the top, sides and rear surfaces of the housing and a second housing member that has the bottom surface of the housing. The two housing members are mated together to form the cavity housing. The top surface of the housing has an aperture formed therein that receives a knob which is a part of the pivoting means. The pivoting means also has a support plate having an aperture therein that receives the knob. The knob has top and bottom surfaces with the top surface extending through the support plate and housing apertures and exposed above the top surface of the housing. The bottom surface has arcuate first and second channels formed therein that receive cam pins disposed in each of the pivoting probe arms. The pivoting probe arms also receive pivot pins that extend into respective pivot pin apertures formed in the support plate. A compliant member is disposed in a recess formed the rear surface of the support plate that is captured between the support plate and the rear surface of the housing that provides axial and lateral rotational movement of the pivoting probing arms. The compliant member may be a non-compressive set, resilient material, such as silicon, compression springs or the like.

The latching means preferably is configured with an aperture formed in the electrical contact pad portion of the flexible substrate and lateral extensions forming respective downward facing shoulders on the sides of the electrical contact pad portion of the flexible substrate. The rear surface of the housing has an outwardly extending protrusion having an upwardly facing recess. Recesses are formed in the opposing attachment arms that extend downward from the top surface to form shouldered surfaces in the attachment arms that are adjacent to the rear surface of the housing. The upwardly facing recess of the outwardly extending protrusion receives the aperture in the electrical contact pad portion of the flexible substrate and the recesses receive the lateral extensions of the electrical contact pad portion of flexible substrate with the downward facing shoulders of the lateral extensions engaging the shouldered surfaces of the recesses for securing the electrical contact pad portion of the flexible substrate to rear surface of the housing.

The objects, advantages and novel features of the present invention are apparent from the following detailed description when read in conjunction with appended claims and attached drawings.

DETAILED DESCRIPTION OF THE PREFERRED EMBODIMENT

Figure 1:
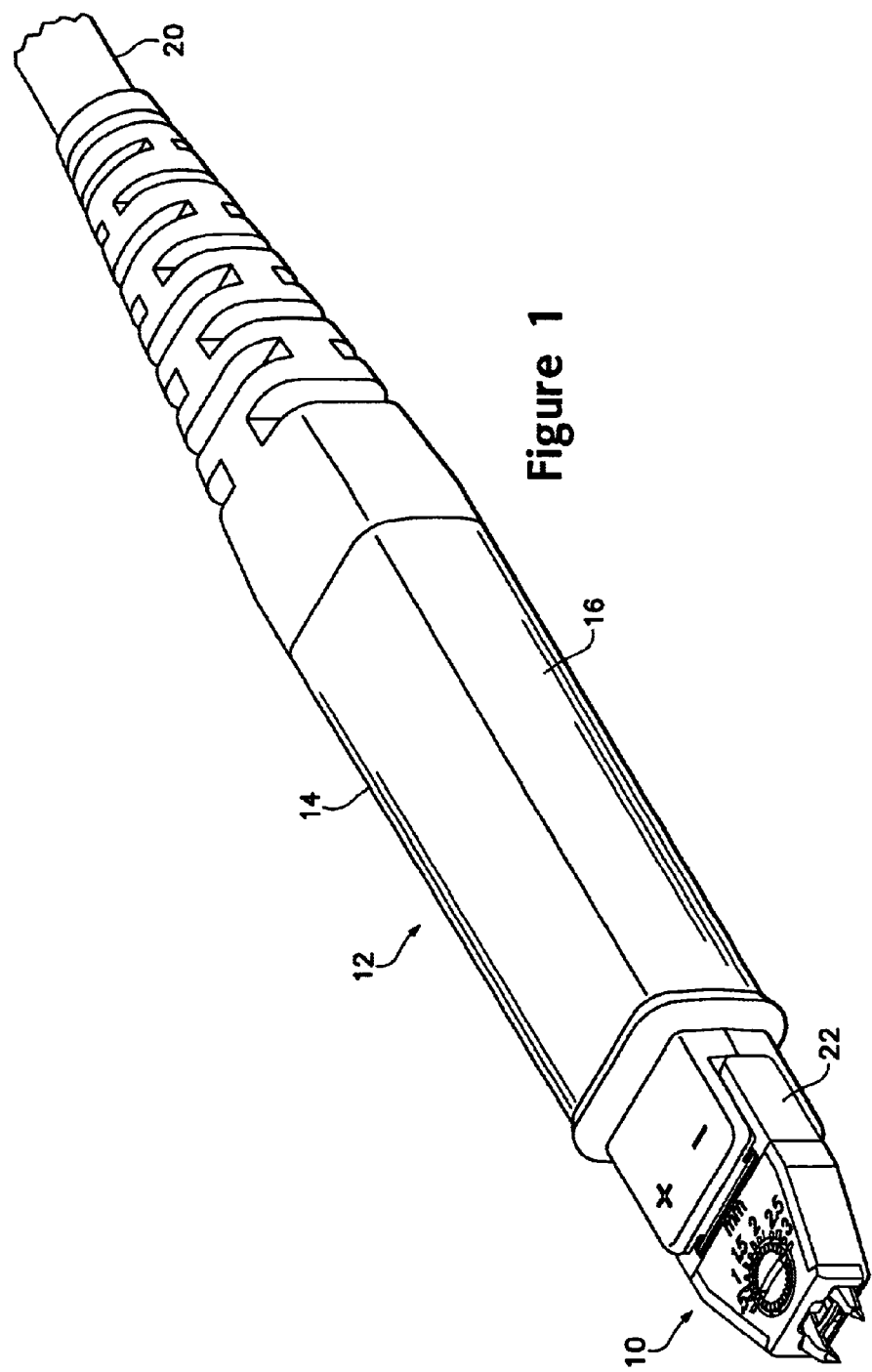
FIG. 1 is a perspective view of a measurement probe with an attached attachable/detachable variable spacing probing tip system according to the present invention.
Figure 2:
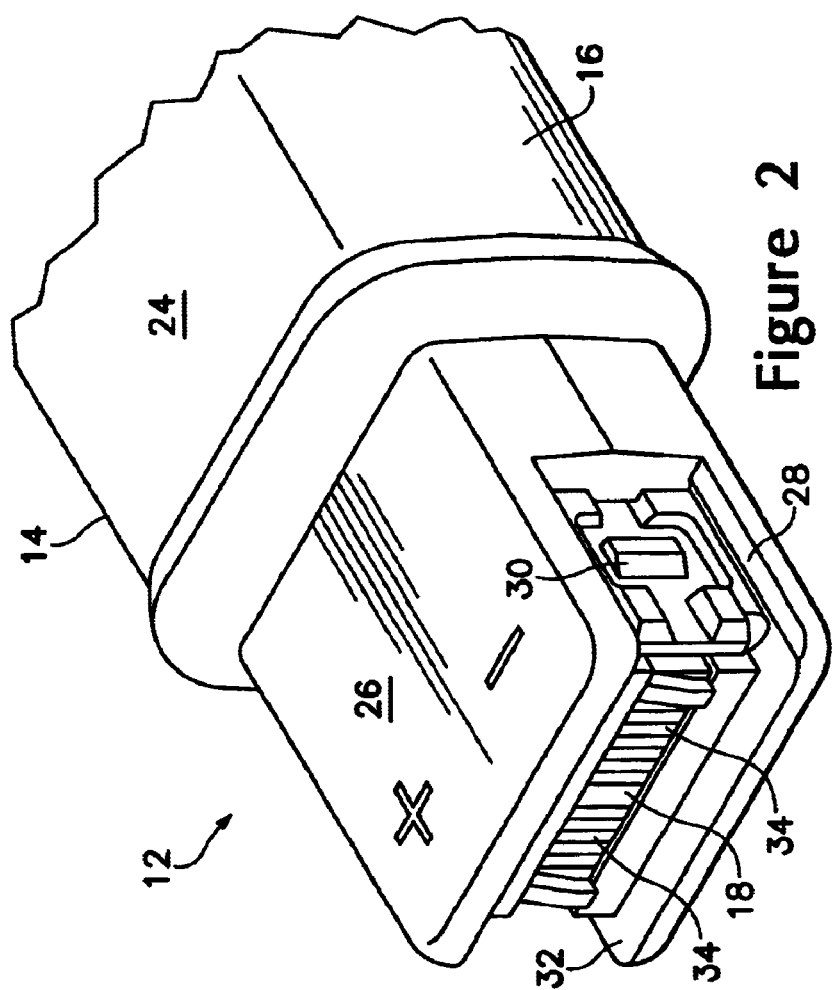
FIG. 2 is a perspective view illustrating the electrical contacts and attachment channels in the measurement probe.

FIG. 1 is a perspective view of the attachable/detachable variable spacing probing tip system 10 attached to a measurement probe 12. The measurement probe 12 has a probe head 14 having an insulating outer cover 16 that encloses a metal tube. Disposed within metal tube is a substrate 18 (as shown in FIG. 2) having electrical circuits formed thereon. For high signal fidelity, wide bandwidth measurement probe, the electrical circuitry on the substrate includes active and passive circuitry for conditioning electrical signals received from a device under test. The electrical circuitry may include precision attenuators, a wide bandwidth buffer amplifier and the like. The conditioned electrical signals are coupled to a measurement instrument, such as an oscilloscope or the like, via a coaxial cable 20. The coaxial cable 20 also includes power and signal lines that provide electrical power to the active circuitry in the probe head 14 and communication signals to and from the probe head 14 for controlling the active circuitry. The attachable/detachable variable spacing probing tip system 10 is mated to the measurement probe 12 using attachment arms 22 extending from the variable spacing probing tip system 10.

FIG. 2 is a perspective view of the front end of the probe head 12. The insulating outer cover 16 transitions from the region 24 enclosing the metal tube to a smaller rectangular region 26 having recessed channels 28 formed on opposing sides that receive the attachment arms 22 of the variable spacing probing tip system 10. Each of the recessed channels 28 has a channel boss 30 that is received in a segmented rib in the attachments arms 22. The smaller rectangular region 26 has an open front face 32 allowing the end surface of the substrate 18 to be exposed at the front end of the probe head 14. The end surface of the substrate 18 has electrical contacts 34 formed thereon that are coupled to the electrical circuitry on the substrate 18. Preferably, the electrical contacts 34 have a dual ground-signal-ground configuration that allows the electrical coupling of the electrical circuitry on the substrate to controlled impedance transmission lines in the variable spacing probing tip system 10 for very wide bandwidth differential probing of a device under test. Alternately, the electrical contacts 34 may be configured with dual signal contacts and a ground contact for coupling electrical signal traces from the variable spacing probing tip system 10 to the electrical circuitry on the substrate 18 in differential probing applications that do not require very wide bandwidth probing.

Figure 3:
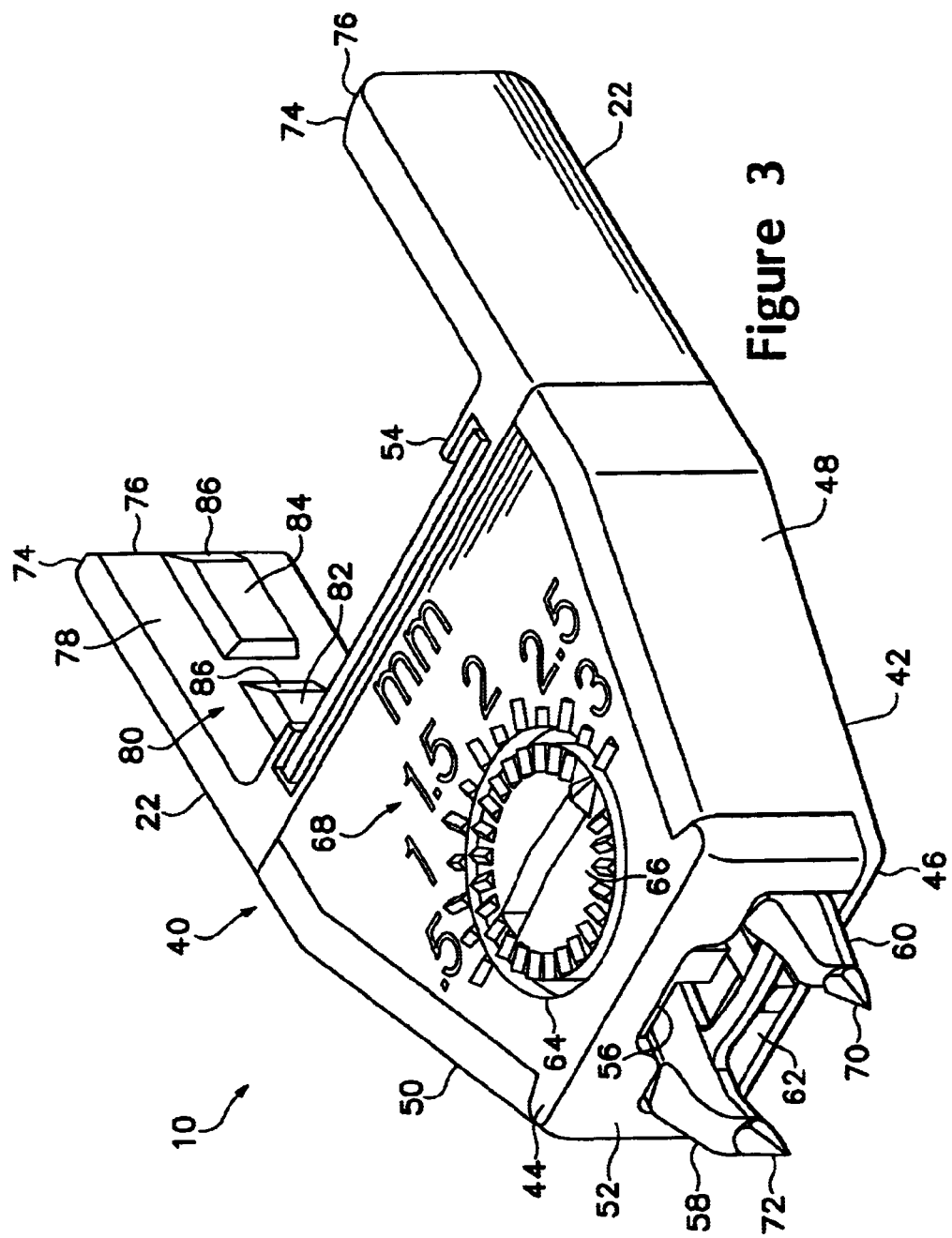
FIG. 3 is a perspective view of the attachable/detachable variable spacing probing tip system according to the present invention.

FIG. 3 is a perspective view of a preferred embodiment of the variable spacing probing tip system 10. The variable spacing probing system 10 has a housing 40 generally configured with a trapezoidal shaped portion 42. The housing 40 has top and bottom surfaces 44, 46, side surfaces 48, 50 and front and rear surfaces 52, 54. The surfaces of the housing define and interior cavity 56 that receives pivoting probing arms 58, 60. The front surface 52 has an opening 62 therein exposing the interior cavity 56 though which the pivoting probing arms 58, 60 extend. The top surface 44 has an aperture 64 formed therein that receives a rotating knob 66 for varying the spacing between the pivoting probing arms 58,60. The top surface 44 also has indices 68 for indicating the spacing between probing contacts 70, 72 on the pivoting probing arms 58, 60. The housing 40 has opposing rearward extending attachment arms 22 that are substantially orthogonal to the rear surface of the housing 40. The distal end 74 of each extension arms 22 is formed with an inwardly disposed bevel 76. The inner surface 78 of each of the attachment arm 22 has a segmented rib 80 with each segment 82,84 having a beveled rearward face 86. The segmented ribs 80 of the attachment arms 22 engage the recessed channels 28 on either side of the smaller rectangular region 26 of the probe head 14. The respective bosses 30 in the recessed channels are captured between the segments 82,84 of the segmented ribs 80 to secure the variable spacing probing tip system 10 to the measurement probe 12.

Figure 4:
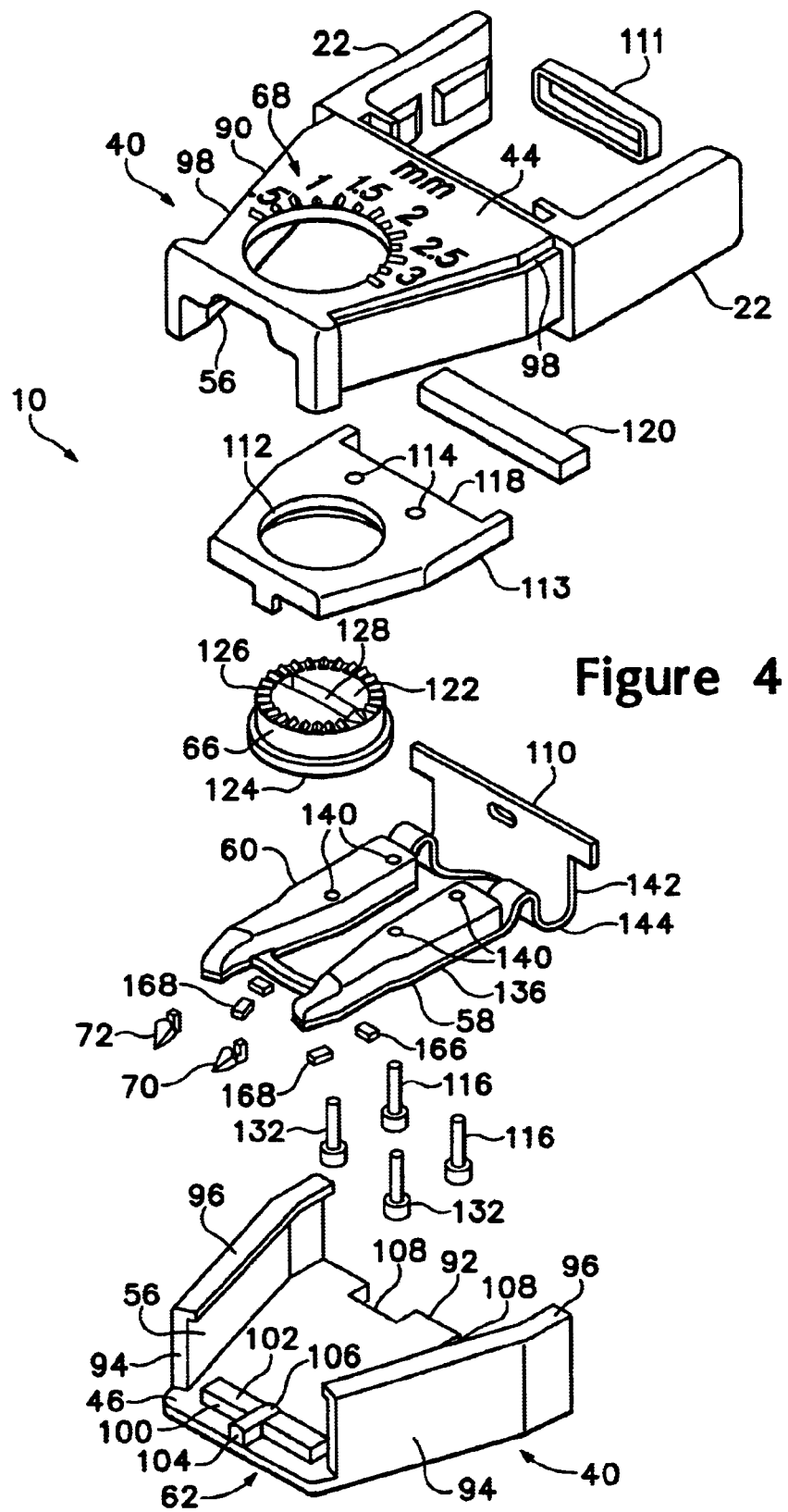
FIG. 4 is an exploded perspective view of the attachable/detachable variable spacing probing tip system according to the present invention.

FIG. 4 is an exploded perspective view of the attachable/detachable variable spacing probing tip system 10. The housing 40 is preferably formed of a top portion 90 and a bottom portion 92. The bottom portion 92 has upwardly extending sides 94 with inwardly disposed shouldered surfaces 96 that engage recesses 98 formed on the top surface 44 of the top portion 90. The interior of the bottom surface 46 adjacent to the opening 62 has a lateral rib 100 with a raised top surface 102 that provides a support surface for the pivoting probing arms 58, 60. An axially disposed rib 104 centered on the lateral rib 100 has a convex top surface 106 extending above the top surface 102 of the lateral rib 100. Slots 108 are formed at the rear of the bottom surface 46 that allow the passage of a flexible substrate 110 that is part of the pivoting probing arms 58, 60. While the slot openings 108 at the rear of the housing 40 are shown as dual slots, the variable spacing probing tip system 10 may equally be formed with a single slot opening in the housing 40. The rear surface 54 of the housing 40 has a recess formed therein that receives a non-compressive set, resilient member 111.

Figure 5:
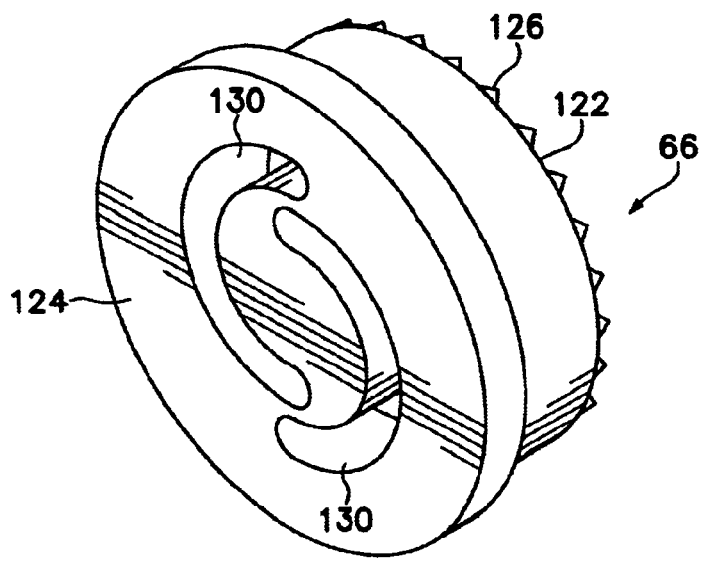
FIG. 5 is a perspective view of the bottom surface of the knob in the attachable/detachable variable spacing probing tip system according to the present invention.

A support plate 113 is disposed in the cavity 56 having an aperture 112 that receives the rotating knob 66. Pivot pin apertures 114 are formed toward the rear of the support plate 113 for receiving pivot pins 116 that have been inserted through the pivoting probing arms 58, 60. The support plate 113 has a rear surface 118 having a recess formed therein that receive a compliant member 120. The rotating knob 66 has top and bottom surfaces 122, 124 with the top surface having raised ribs 126 disposed normal to the periphery of the knob 66 and a slotted dial indicator 128 for indicating, in relation to the indices 68 on the top surface 44 of the housing 40, the spacing between the probing contacts 70, 72. The bottom surface 124 of the knob 66 has arcuate channels 130, as shown in FIG. 5, that receive cam pins 132 that have been inserted through the pivoting probing arms 58, 60. The rotating knob 66 is closely received in the aperture 112 of the support plate 113. The support plate 113 is positioned within the cavity 56 in the housing 40 adjacent to the top surface of the housing 40 with the front of the support plate 113 abutting the front surface 52 of the housing 40 and the compliant member 120 abutting the rear surface 54 of the housing 40. The rotating knob 66 extends through the aperture 64 formed in the top surface 44 of the housing 40 which is oversized in relation to the size of the rotating knob 66 to allow the knob 66 to move freely in the aperture 64. The top surface 122 of the rotating knob 66 extends above the top surface 44 of the housing 40.

Figure 6:
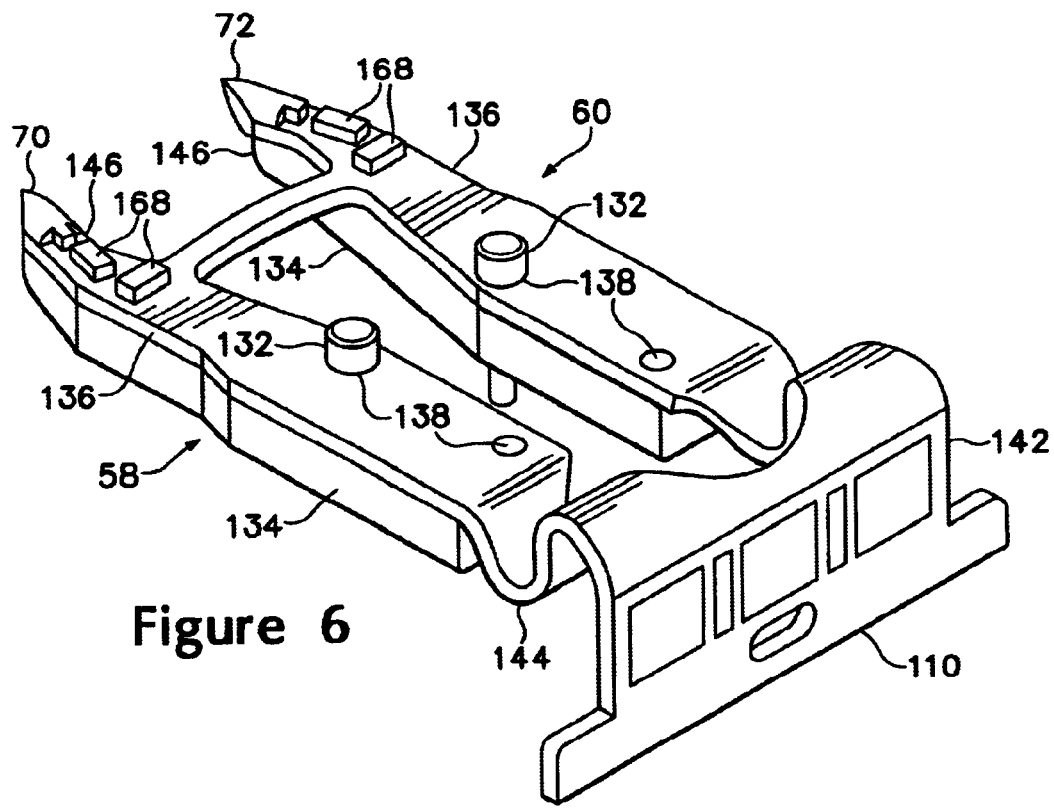
FIG. 6 is a perspective view of the pivoting probing arms in the attachable/detachable variable spacing probing tip system according to the present invention.

Each of the pivoting probing arms 58, 60 has a support member 134 on which is secured probing arm portions 136 of the flexible substrate 110. As shown in greater detail in the perspective view of FIG. 6, the probe arm portions 136 of the flexible substrate 110 extend the length of the support members 134 and have apertures 138 formed therein that correspond to apertures 140 formed in the support member 134 for receiving the pivot pins 116 and the cam pins 132. The probe arm portions 136 extend past the end of the support members 134 and are integrally formed with a electrical contact pad portion 142 of the flexible substrate 110. Each of the probe arm portions 136 has a generally S-shaped fold 144 formed in it between the ends of the support members 134 and the electrical contact pad portion 142. The probing contacts 70, 72 are secured in the distal end 146 of the pivoting probing arms 58, 60.

Figure 7:
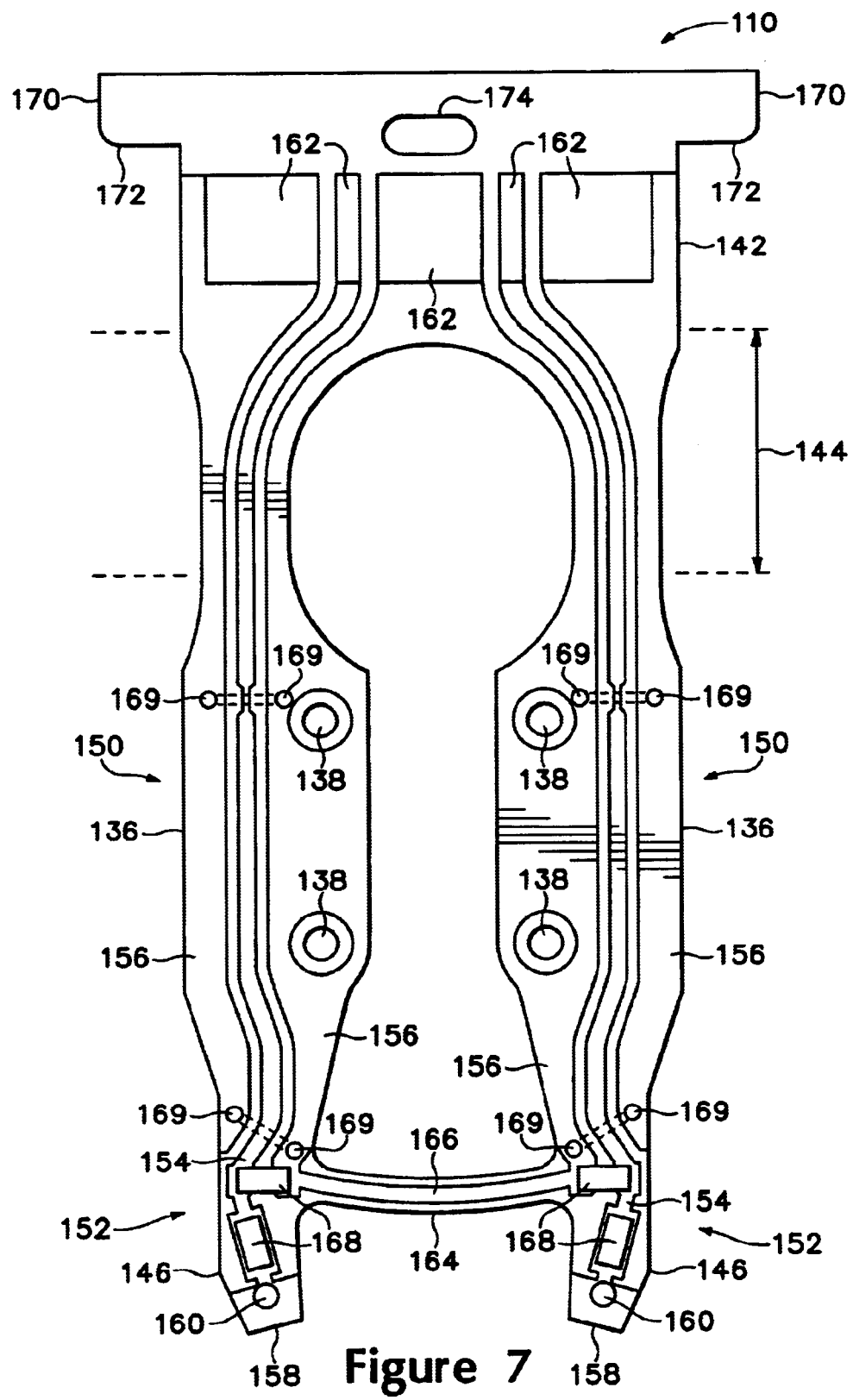
FIG. 7 is a plan view of the flexible substrate in the attachable/detachable variable spacing probing tip system according to the present invention.

Referring to FIG. 7, there is illustrated a plan view of the flexible substrate 110. Like elements from the previous drawings are labeled the same. In the preferred embodiment of the invention, each of the probe arm portions 136 of the flexible substrate 110 has electrical contact traces 150 configured as a controlled impedance transmission line. More specifically, the electrical contact traces 150 form a coplanar transmission line 152 with the center trace being the signal conductor trace 154 and the traces on either side of the signal conductor trace 154 being ground traces 156. A contact pad 158 formed in each of the signal conductor traces 154 at the distal end 146 of the pivoting probing arms 58, 60. The contact pads 158 are preferably formed with apertures 160 in them that are coextensive with bores formed in the support members 134. The other ends of the signal conductor and ground traces 146 and 156 are coupled to electrical contact pads 162 formed on the electrical contact pad portion 142 of the flexible substrate 110. The flexible substrate 110 may be formed with a lateral member 164 that is disposed adjacent to the distal ends 146 of the pivoting probing arms 58, 60. The lateral member 164 has an electrically conductive trace 166 that coupled the ground traces 156 of the pivoting probing arms 58, 60 to form a short differential return path to permit very high speed operation. The ground traces 156 on each of the pivoting probing arms 58, 60 may be electrically coupled together by a conductive trace form on the reverse side of the flexible substrate 110 and connected to the ground traces 156 by electrically conductive vias 169.

Electrical components 168 may be mounted on the probe arm portions 136 to condition the signals from the device under test. The electrical components 168, such as resistive and capacitive elements, may form a portion of a compensated RC attenuator circuit. The resistive and capacitive elements 168 may take the form a discrete components or printed-on devices using well known thick film processing methods. The controlled impedance transmission lines may also be configured as microstrip transmission lines where the signal conductor trace 154 is on one surface of the flexible substrate 110 and the ground trace 156 is below the signal conductor trace 154 on the opposing surface or an intermediate layer of the flexible substrate 110. Alternately, the probe arm portions 136 of the flexible substrate 110 may have signal contact traces that are not configured as controlled impedance transmission lines. In such cases, the ground traces are only required for providing a ground connection for the electrical components 168 mounted on the probe arm portions 136.

The electrical contact pad portion 142 of the flexible substrate 110 is formed with laterally extending protrusions 170 that form downwardly facing shoulder surfaces 172. An aperture 174 is centrally formed in the electrical contact pad portion 142 above the electrical contact pads 162. The laterally extending protrusions 170 and the aperture 174 form part of the latching mechanism for the securing the electrical contact pad portion 142 of the flexible substrate 110 to the rear surface 54 of the housing 40 to be described in greater detail below.

Figure 8A:
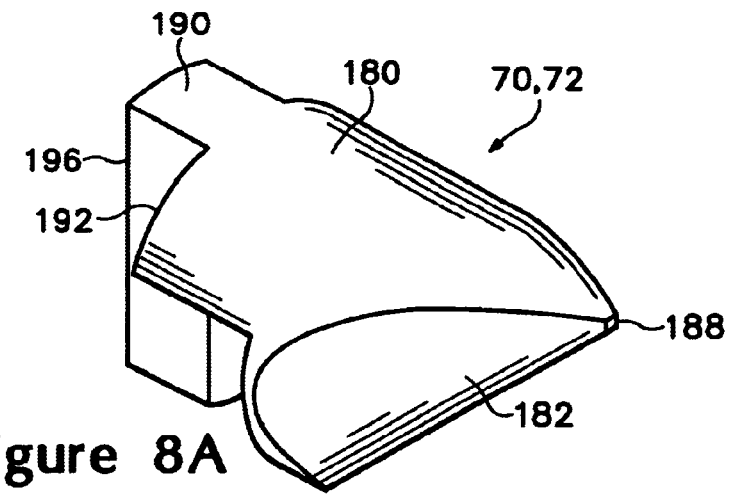
FIGS. 8A through 8C are respective perspective, side and bottom views of the probing contacts in the attachable/detachable variable spacing probing tip system according to the present invention.
Figure 8B:
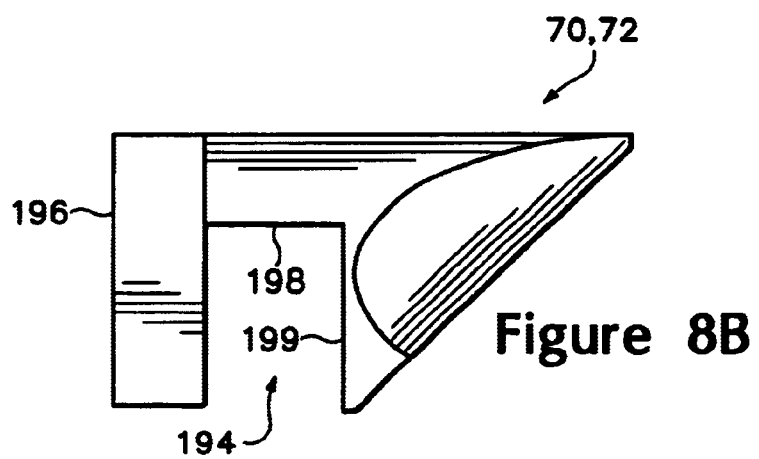
Figure 8C:
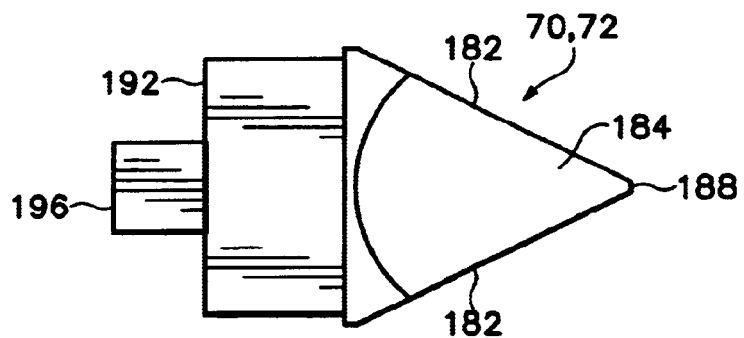

Referring to FIGS. 8A through 8C, there are shown various views of a first embodiment of the probing contacts 70, 72. FIG. 8A is a perspective view of the probing contacts 70, 72 having an arcuate top surface 180 and beveled and angles side surfaces 182 that form a triangular shape 184 (as best shown in the bottom plan view of FIG. 8C.) extending outward to a point 188 on the top surface 180 at the front of the contacts. A generally rectangular shaped protrusion 190 is formed on the back surface 192 of the probing contacts 70, 72. The side view of FIG. 8B shows the probing contacts 70, 72 having a notch 194 formed between the beveled and angled side surfaces 182 and the rear surface protrusion 190 creating a post 196 at the opposite end of the point 188. The posts 196 are passed through the apertures 160 in the contact pads 158 coupled to the signal conductor trace 154 and received in the bores at the distal ends of the pivoting probing arms 58, 60. The top and frontal surfaces 198, 199 of the probing contact 70, 72 abut the respective top and front surfaces of the pivoting probing arms 58, 60. The probing contacts 70, 72 are soldered to the contact pads 158 of the signal conductor traces 154. The front portion 200 may also be tapered to a point by means of angles sides forming a "chisel" point.

Figure 9:
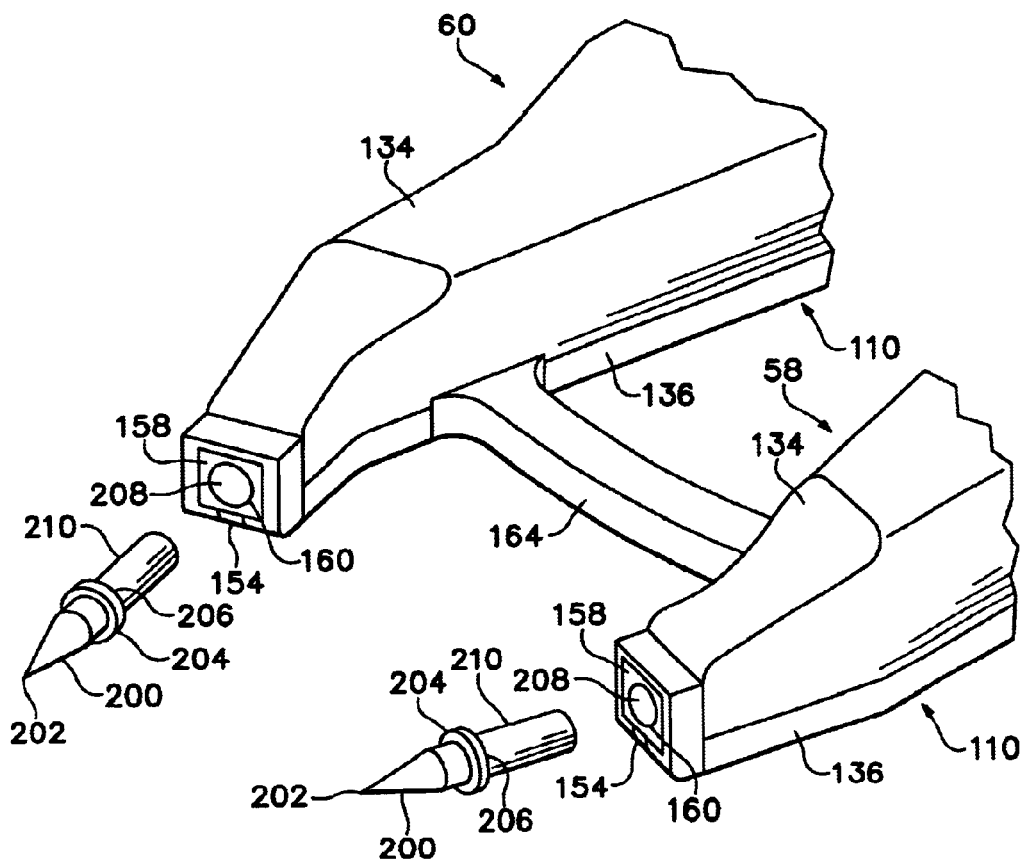
FIG. 9, is a perspective view of a further embodiment of the probing contacts in the attachable/detachable variable spacing probing tip system according to the present invention.

Referring to FIG. 9, there is shown a further embodiment of the probing contacts 70, 72. The probing contacts 70, 72 have a circular form with the front portion 200 being tapered to form a point 202. Disposed along the body of each of the probing contacts 70, 72 is a flange 204 forming a shouldered surface 206. Each of the pivoting probing arms 58, 60 has a bore 208 formed in the from face of the support member 134. The probing arm portions 136 of the flexible substrate 110 extend over the front faces of the support members 134 with the apertures 160 in the contact pads 158 being coextensive with the bores 208. The rear portions 210 of the probing contacts 70, 72 are positioned in the bore 208 with the shouldered surfaces 206 of the flanges 204 seated against the contact pads 158 and the tapered front portions 200 extending out from the pivoting probing arms 58, 60. The probing contacts 70, 72 are soldered to the contact pads 158 of the signal conductor traces 154.

Figure 10:
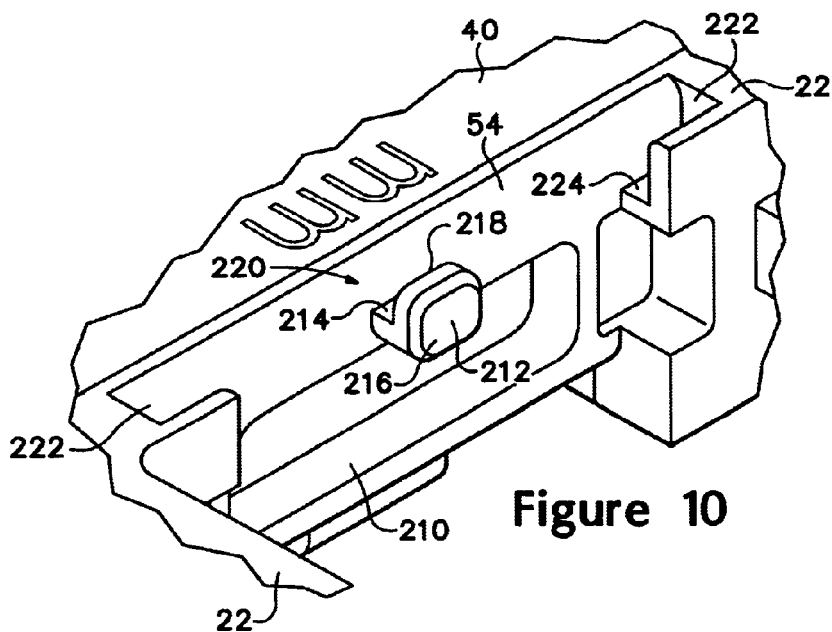
FIG. 10 is a partial perspective view of the rear surface of the housing in the attachable/detachable variable spacing probing tip system according to the present invention.

FIG. 10 is a partial perspective view of the rear surface 54 of the housing 40. The rear surface 54 has a recess 210 formed therein that receives the non-compressive set, resilient member 111. An outwardly extending protrusion 212 is formed on the rear surface and laterally centered above the recess 210. The outwardly extending protrusion 212 had an outwardly extending generally flat inner surface 214 that transition into an upwardly extending shoulder portion 216 having a generally flat inner surface 218 forming a recess 220. The attachment arms 22 have recesses 222 formed therein at the junction between the arms 22 and the rear surface 54 of the housing 40. The recesses 222 extend downward from the top surface of the attachment arms 22 forming a shouldered surface 224 partway down the arms.

Figure 11:
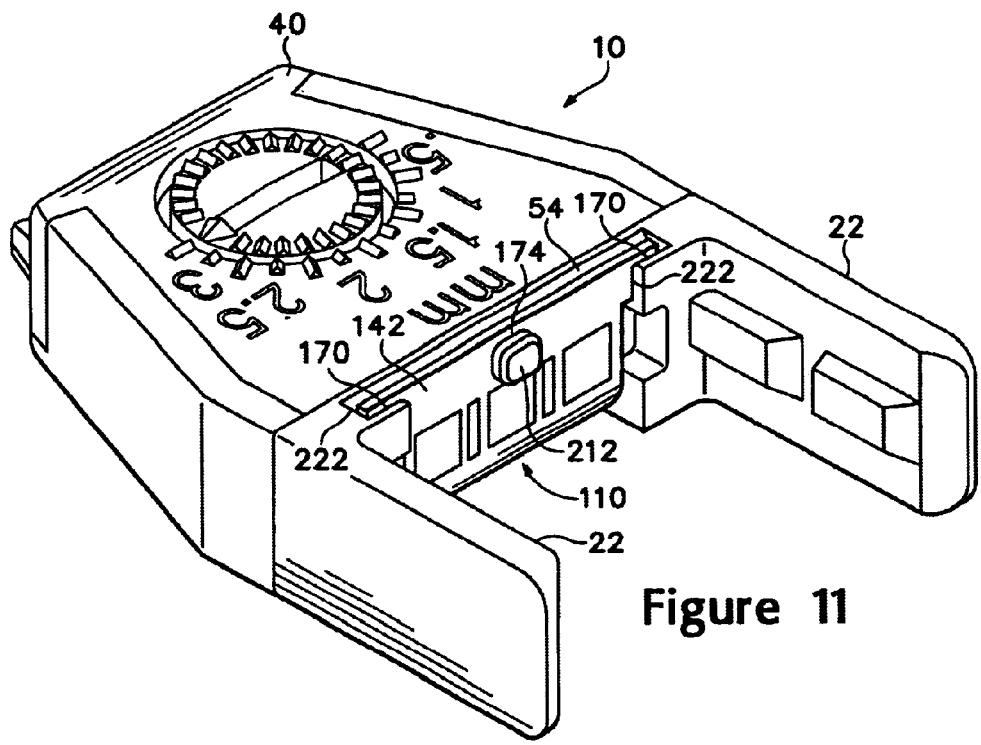
FIG. 11 is a perspective view of the flexible substrate latched to the rear surface of the housing in the attachable/detachable variable spacing probing tip system according to the present invention.

Referring to FIG. 11, there is shown a perspective view of variable spacing probing tip system 10 showing the rear surface 54 of the housing 40. The electrical contact pad portion 142 of the flexible substrate 110 is latched to the rear surface 54 of the housing 40 by positioning the aperture 174 in the electrical contact pad portion 142 over the outwardly extending protrusion 212 such that a portion of the flexible substrate 110 is captured in the recess 220 formed by the inner surfaces 214 and 218 of the outwardly extending protrusion 212. The laterally extending protrusions 170 on the electrical contact pad portion 142 of the flexible substrate 110 are received in the recesses 222 in the attachment arms 22 with the downwardly facing shoulders 172 of the protrusions 170 abutting the shouldered surfaces 224 of the recesses 222.

The top and bottom portions 90, 92 of the housing 40 are preferably formed of an injection moldable poly-carbonate material. The support plate 113 is preferably formed of an injection moldable poly-carbonate material with a TEFLON® fill that provides a lubricating affect against the housing and the rotatable knob 66. The rotating knob is preferably formed of a lubricating crystalline material, such as DELRIN® (sp), manufactured and sold by Dupont, Wilmington, Del. The support member 134 of the pivoting probing arms 58, 60 are preferably formed of a polyether injection moldable material, such as ULTEM®, manufactured and sold by General Electric Co., Brea, Calif. The compliant member 120 is preferably formed of a elastomeric material, such as silicone.

The attachable/detachable variable spacing probing tip system 10 provides an a very wide bandwidth differential probing solution above 10 GHz. The variable spacing probing tip system 10 is easily secured to a probe head 14 of a measurement probe 12 by the segmented ribs 80 of the attachment arms 22 engaging the channel bosses 30 in the probe head 14. The electrical contact pads 162 on the electrical contact pad portions 142 of the flexible substrate 110 make positive contact with the electrical contacts 34 of the measurement probe 12 by the pressure applied by the non-compressive set, resilient member 111 disposed in the recess 210 in the rear surface 54 of the housing 40. The probing contacts 70, 72 on the pivoting probing arms 58, 60 may be adjusted from a minimum separation of 0.0010 inches to 0.0128 inches using the rotatable knob 66. As the knob 66 is rotated, the cam pins 132 attached to the pivoting probing arms 58, 60 travel in the arcuate channels 130 in the knob 66 causing the pivoting probing arms to rotate about the pivot pins 116 extending through the pivoting probing arms 58, 60 and into the support plate 113. During the pivoting movements of the probing arms 58, 60, the lateral member 164 at the distal end 146 of the probing arms 58, 60 flexes upward in response to the convex top surface 106 of the axially disposed rib 104 in the opening 62 of the housing 40. The flexible substrate 110 is able to take-up the pivoting movement of the probing arms 58, 60 by the S-shaped folds 144 in the probing arms portions 136. Without the S-shaped folds, the flexible substrate 110 runs the risk of deforming, stretching or tearing which would degrade the signal bandwidth of the measurement probe.

An attachable/detachable variable spacing probing tip system has been described that provides variable spacing differential probing capabilities for a wide bandwidth probe. The variable spacing probing tip system has a housing that receives pivoting probing arms that pivot using a knob extending through the top of the housing. Each probing arm has a support member and a probing arm portion of a flexible substrate. Each of the probing arm portions has a conductive trace thereon with one end of each conductive trace coupled to a probing contact and the other end coupled to an electrical contact pad on a electrical contact pad portion of the flexible substrate. The conductive trace is preferably configured as a controlled impedance transmission line with each trace having associated ground conductor traces. Each of the probing arm portions has a generally S-shaped fold therein extending from the support members to the electrical contact portion of the flexible substrate. The knob is part of a pivoting means that includes a support plate and pivot pins inserted through the pivoting probing arms and into the support plate and cam pins inserted through the pivoting probing arms and into arcuate cam channels in the knob. The rear surface of the housing has a resilient member disposed therein. Latching means in the housing secures the electrical contact pad portion of the flexible substrate to the rear surface of the housing. The housing has opposing attachment arms extending from the rear surface of the housing that mate with channels in the probe head for attaching the variable spacing probing tip system to the probe head.

It will be obvious to those having skill in the art that many changes may be made to the details of the above-described embodiments of this invention without departing from the underlying principles thereof. The scope of the present invention should, therefore, be determined only by the following claims.

What is claimed is:

1. An attachable/detachable variable spacing probing tip system for a measurement probe comprising:
   a housing having a cavity therein defined by top, bottom, side and rear surfaces with the cavity exposed at an opening in the housing opposite the rear surface and opposing attachment arms extending generally orthogonally from a rear surface of the housing;
   at least a first non-compressive set, resilient member disposed in the rear surface of the housing;
   first and second pivoting probing arms disposed in the cavity of the housing with the distal ends of the first and second probing arms extending outward from the opening in the housing, the first and second pivoting probing tip arms having first and second support members and first and second probing arm portions of a flexible substrate secured to the respective first and second support members, the flexible substrate having an electrical contact pad portion with at least first and second electrical contact pads and each of the first and second probing arm portions having at least a first electrically conductive trace with one end of each of the electrically conductive traces coupled to one of the first and second electrical contact pads and the other end coupled to a probing contact with each of the first and second probing arm portions having a generally S-shaped fold therein extending from the first and second support members to the electrical contact pad portion of the flexible substrate with the electrical contact pad portion extending from the rear surface of the housing;
   means disposed in the housing for pivoting the first and second pivoting probing arms; and
   latching means for securing the electrical contact pad portion of the flexible substrate to the rear surface of the housing with the first and second electrical contact pads disposed adjacent to the non-compressive set, resilient member.

2. The attachable/detachable variable spacing probing tip system as recited in claim 1 wherein each of the first and second electrically conductive traces further comprises passive electrical elements disposed on the flexible substrate and electrically coupled to the respective first and second conductive traces.

3. The attachable/detachable variable spacing probing tip system as recited in claim 2 wherein the passive electrical elements comprise discrete surface mounted resistive elements.

4. The attachable/detachable variable spacing probing tip system as recited in claim 2 wherein the passive electrical elements comprise printed resistive elements formed on the flexible substrate.

5. The attachable/detachable variable spacing probing tip system as recited in claim 2 wherein the passive electrical elements comprise discrete surface mounted resistive and capacitive elements.

6. The attachable/detachable variable spacing probing tip system as recited in claim 2 wherein the passive electrical elements comprise printed resistive and capacitive elements formed on the flexible substrate.

7. The attachable/detachable variable spacing probing tip system as recited in claim 1 wherein the electrical conductive traces on each of the probing arms portions of the flexible substrate further comprises a controlled impedance transmission line.

8. The attachable/detachable variable spacing probing tip system as recited in claim 7 wherein the controlled impedance transmission line further comprises a coplanar waveguide having a signal conductor trace and adjacent ground traces disposed on either side of the signal conductor trace.

9. The attachable/detachable variable spacing probing tip system as recited in claim 8 wherein each of the signal and ground traces of each coplanar waveguide is coupled to a corresponding electrical contact pad disposed on the electrical contact pad portion of the flexible substrate.

10. The attachable/detachable variable spacing probing tip system as recited in claim 7 wherein the controlled impedance transmission line further comprises a microstrip waveguide having a signal conductor trace on one surface of the flexible substrate a ground trace disposed below the signal conductor trace on another surface of the flexible substrate.

11. The attachable/detachable variable spacing probing tip system as recited in claim 10 wherein each of the signal and ground traces of each microstrip waveguide is coupled to a corresponding electrical contact pad disposed on the electrical contact pad portion of the flexible substrate.

12. The attachable/detachable variable spacing probing tip system as recited in claim 1 wherein the flexible substrate further comprises a lateral member disposed adjacent to the distal ends of the first and second pivoting probing arms and connected to the first and second probing arm portions.

13. The attachable/detachable variable spacing probing tip system as recited in claim 12 wherein the bottom surface of the housing has a raised surface laterally disposed in the opening of the housing for supporting the first and second pivoting probing arms and an axial raised portion disposed in the opening of the housing having an convex top surface extending above the laterally disposed raised surface coextensive with the lateral member of the flexible substrate.

14. The attachable/detachable variable spacing probing tip system as recited in claim 1 wherein the housing further comprises a first member having the top, side and rear surfaces of the housing with the top surface having an aperture therein and second member mounted to the first member having the bottom surface of the housing.

15. The attachable/detachable variable spacing probing tip system as recited in claim 14 wherein the pivoting means comprises:
a support plate disposed within the housing cavity having an aperture therein;
a knob having a top surface and a bottom surface disposed through the support plate aperture and the housing aperture, the top surface of the knob being exposed above the top surface of the housing and the bottom surface having first and second arcuate channels formed therein;
respective pivot pins disposed in each of the first and second pivoting probing arms and extending into respective pin apertures in the support plate;
respective cam pins disposed in each of the first and second pivoting probe arms and with each of the respective cam pins disposed in one of the first and second arcuate channels in the knob.

16. The attachable/detachable variable spacing probing tip system as recited in claim 15 further comprising a compliant member disposed in the housing adjacent to a rear surface of the support plate providing axial and lateral rotational movement of the first and second pivoting probing arms.

17. The attachable/detachable variable spacing probing tip system as recited in claim 16 wherein the compliant member comprises a non-compressive set, resilient material.

18. The attachable/detachable variable spacing probing tip system as recited in claim 1 wherein the attachment arms have a top surface and the latching means comprises:
an aperture formed in the electrical contact pad portion of the flexible substrate and lateral extensions forming respective downward facing shoulders on the sides of the electrical contact pad portion of the flexible substrate; and
an outwardly extending protrusion on the rear surface of the housing having an upwardly facing recess and recesses formed in the opposing attachment arms that extend downward from the top surface to form shouldered surfaces in the attachment arms that are adjacent to the rear surface of the housing wherein the upwardly facing recess of the outwardly extending protrusion receives the aperture in the electrical contact pad portion of the flexible substrate and the recesses receive the lateral extensions of the electrical contact pad portion of flexible substrate with the downward facing shoulders of the lateral extensions engaging the shouldered surfaces of the recesses.

* * * * *